United States Patent
Kaiser et al.

(10) Patent No.: US 9,214,169 B1
(45) Date of Patent: Dec. 15, 2015

(54) MAGNETIC RECORDING READ TRANSDUCER HAVING A LAMINATED FREE LAYER

(71) Applicant: Western Digital (Fremont), LLC, Fremont, CA (US)

(72) Inventors: Christian Kaiser, San Jose, CA (US); Yuankai Zheng, Fremont, CA (US); Xin Jiang, San Jose, CA (US); Zhitao Diao, Fremont, CA (US); Qunwen Leng, Palo Alto, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 14/310,222

(22) Filed: Jun. 20, 2014

(51) Int. Cl.
*G11B 5/33* (2006.01)
*G11B 5/39* (2006.01)

(52) U.S. Cl.
CPC .. *G11B 5/33* (2013.01); *G11B 5/39* (2013.01); *G11B 5/3903* (2013.01); *G11B 5/3967* (2013.01)

(58) Field of Classification Search
USPC .......... 360/313, 324, 324.1, 324.12
See application file for complete search history.

(56) References Cited

U.S. PATENT DOCUMENTS

| | | | |
|---|---|---|---|
| 6,016,290 A | 1/2000 | Chen et al. |
| 6,018,441 A | 1/2000 | Wu et al. |
| 6,025,978 A | 2/2000 | Hoshi et al. |
| 6,025,988 A | 2/2000 | Yan |
| 6,032,353 A | 3/2000 | Hiner et al. |
| 6,033,532 A | 3/2000 | Minami |
| 6,034,851 A | 3/2000 | Zarouri et al. |
| 6,043,959 A | 3/2000 | Crue et al. |
| 6,046,885 A | 4/2000 | Aimonetti et al. |
| 6,049,650 A | 4/2000 | Jerman et al. |
| 6,055,138 A | 4/2000 | Shi |
| 6,058,094 A | 5/2000 | Davis et al. |
| 6,073,338 A | 6/2000 | Liu et al. |
| 6,078,479 A | 6/2000 | Nepela et al. |
| 6,081,499 A | 6/2000 | Berger et al. |
| 6,094,803 A | 8/2000 | Carlson et al. |
| 6,099,362 A | 8/2000 | Viches et al. |
| 6,103,073 A | 8/2000 | Thayamballi |
| 6,108,166 A | 8/2000 | Lederman |
| 6,118,629 A | 9/2000 | Huai et al. |
| 6,118,638 A | 9/2000 | Knapp et al. |
| 6,125,018 A | 9/2000 | Takagishi et al. |
| 6,130,779 A | 10/2000 | Carlson et al. |
| 6,134,089 A | 10/2000 | Barr et al. |
| 6,136,166 A | 10/2000 | Shen et al. |
| 6,137,661 A | 10/2000 | Shi et al. |
| 6,137,662 A | 10/2000 | Huai et al. |
| 6,160,684 A | 12/2000 | Heist et al. |
| 6,163,426 A | 12/2000 | Nepela et al. |
| 6,166,891 A | 12/2000 | Lederman et al. |
| 6,173,486 B1 | 1/2001 | Hsiao et al. |
| 6,175,476 B1 | 1/2001 | Huai et al. |
| 6,178,066 B1 | 1/2001 | Barr |

(Continued)

*Primary Examiner* — Wayne Young
*Assistant Examiner* — Carlos E Garcia

(57) ABSTRACT

A method and system provide a magnetic transducer including a first shield, a read sensor, and a second shield. The read sensor is between the first shield and the second shield. The read sensor includes a pinned layer, a nonmagnetic spacer layer and a free layer. The nonmagnetic spacer layer is between the pinned layer and the free layer. The free layer includes a plurality of ferromagnetic layers interleaved with and sandwiching a plurality of nonmagnetic layers. The plurality of ferromagnetic layers are ferromagnetically aligned.

15 Claims, 6 Drawing Sheets

(56) References Cited

U.S. PATENT DOCUMENTS

| | | |
|---|---|---|
| 6,178,070 B1 | 1/2001 | Hong et al. |
| 6,178,150 B1 | 1/2001 | Davis |
| 6,181,485 B1 | 1/2001 | He |
| 6,181,525 B1 | 1/2001 | Carlson |
| 6,185,051 B1 | 2/2001 | Chen et al. |
| 6,185,077 B1 | 2/2001 | Tong et al. |
| 6,185,081 B1 | 2/2001 | Simion et al. |
| 6,188,549 B1 | 2/2001 | Wiitala |
| 6,190,764 B1 | 2/2001 | Shi et al. |
| 6,193,584 B1 | 2/2001 | Rudy et al. |
| 6,195,229 B1 | 2/2001 | Shen et al. |
| 6,198,608 B1 | 3/2001 | Hong et al. |
| 6,198,609 B1 | 3/2001 | Barr et al. |
| 6,201,673 B1 | 3/2001 | Rottmayer et al. |
| 6,204,998 B1 | 3/2001 | Katz |
| 6,204,999 B1 | 3/2001 | Crue et al. |
| 6,212,153 B1 | 4/2001 | Chen et al. |
| 6,215,625 B1 | 4/2001 | Carlson |
| 6,219,205 B1 | 4/2001 | Yuan et al. |
| 6,221,218 B1 | 4/2001 | Shi et al. |
| 6,222,707 B1 | 4/2001 | Huai et al. |
| 6,229,782 B1 | 5/2001 | Wang et al. |
| 6,230,959 B1 | 5/2001 | Heist et al. |
| 6,233,116 B1 | 5/2001 | Chen et al. |
| 6,233,125 B1 | 5/2001 | Knapp et al. |
| 6,237,215 B1 | 5/2001 | Hunsaker et al. |
| 6,252,743 B1 | 6/2001 | Bozorgi |
| 6,255,721 B1 | 7/2001 | Roberts |
| 6,258,468 B1 | 7/2001 | Mahvan et al. |
| 6,266,216 B1 | 7/2001 | Hikami et al. |
| 6,271,604 B1 | 8/2001 | Frank, Jr. et al. |
| 6,275,354 B1 | 8/2001 | Huai et al. |
| 6,277,505 B1 | 8/2001 | Shi et al. |
| 6,282,056 B1 | 8/2001 | Feng et al. |
| 6,296,955 B1 | 10/2001 | Hossain et al. |
| 6,297,955 B1 | 10/2001 | Frank, Jr. et al. |
| 6,304,414 B1 | 10/2001 | Crue, Jr. et al. |
| 6,307,715 B1 | 10/2001 | Berding et al. |
| 6,310,746 B1 | 10/2001 | Hawwa et al. |
| 6,310,750 B1 | 10/2001 | Hawwa et al. |
| 6,317,290 B1 | 11/2001 | Wang et al. |
| 6,317,297 B1 | 11/2001 | Tong et al. |
| 6,322,911 B1 | 11/2001 | Fukagawa et al. |
| 6,330,136 B1 | 12/2001 | Wang et al. |
| 6,330,137 B1 | 12/2001 | Knapp et al. |
| 6,333,830 B2 | 12/2001 | Rose et al. |
| 6,340,533 B1 | 1/2002 | Ueno et al. |
| 6,349,014 B1 | 2/2002 | Crue, Jr. et al. |
| 6,351,355 B1 | 2/2002 | Min et al. |
| 6,353,318 B1 | 3/2002 | Sin et al. |
| 6,353,511 B1 | 3/2002 | Shi et al. |
| 6,356,412 B1 | 3/2002 | Levi et al. |
| 6,359,779 B1 | 3/2002 | Frank, Jr. et al. |
| 6,369,983 B1 | 4/2002 | Hong |
| 6,376,964 B1 | 4/2002 | Young et al. |
| 6,377,535 B1 | 4/2002 | Chen et al. |
| 6,381,095 B1 | 4/2002 | Sin et al. |
| 6,381,105 B1 | 4/2002 | Huai et al. |
| 6,389,499 B1 | 5/2002 | Frank, Jr. et al. |
| 6,392,850 B1 | 5/2002 | Tong et al. |
| 6,396,660 B1 | 5/2002 | Jensen et al. |
| 6,399,179 B1 | 6/2002 | Hanrahan et al. |
| 6,400,526 B2 | 6/2002 | Crue, Jr. et al. |
| 6,404,600 B1 | 6/2002 | Hawwa et al. |
| 6,404,601 B1 | 6/2002 | Rottmayer et al. |
| 6,404,706 B1 | 6/2002 | Stovall et al. |
| 6,410,170 B1 | 6/2002 | Chen et al. |
| 6,411,522 B1 | 6/2002 | Frank, Jr. et al. |
| 6,417,998 B1 | 7/2002 | Crue, Jr. et al. |
| 6,417,999 B1 | 7/2002 | Knapp et al. |
| 6,418,000 B1 | 7/2002 | Gibbons et al. |
| 6,418,048 B1 | 7/2002 | Sin et al. |
| 6,421,211 B1 | 7/2002 | Hawwa et al. |
| 6,421,212 B1 | 7/2002 | Gibbons et al. |
| 6,424,505 B1 | 7/2002 | Lam et al. |
| 6,424,507 B1 | 7/2002 | Lederman et al. |
| 6,430,009 B1 | 8/2002 | Komaki et al. |
| 6,430,806 B1 | 8/2002 | Chen et al. |
| 6,433,965 B1 | 8/2002 | Gopinathan et al. |
| 6,433,968 B1 | 8/2002 | Shi et al. |
| 6,433,970 B1 | 8/2002 | Knapp et al. |
| 6,437,945 B1 | 8/2002 | Hawwa et al. |
| 6,445,536 B1 | 9/2002 | Rudy et al. |
| 6,445,542 B1 | 9/2002 | Levi et al. |
| 6,445,553 B2 | 9/2002 | Barr et al. |
| 6,445,554 B1 | 9/2002 | Dong et al. |
| 6,447,935 B1 | 9/2002 | Zhang et al. |
| 6,448,765 B1 | 9/2002 | Chen et al. |
| 6,451,514 B1 | 9/2002 | Iitsuka |
| 6,452,742 B1 | 9/2002 | Crue et al. |
| 6,452,765 B1 | 9/2002 | Mahvan et al. |
| 6,456,465 B1 | 9/2002 | Louis et al. |
| 6,459,552 B1 | 10/2002 | Liu et al. |
| 6,462,920 B1 | 10/2002 | Karimi |
| 6,466,401 B1 | 10/2002 | Hong et al. |
| 6,466,402 B1 | 10/2002 | Crue, Jr. et al. |
| 6,466,404 B1 | 10/2002 | Crue, Jr. et al. |
| 6,468,436 B1 | 10/2002 | Shi et al. |
| 6,469,877 B1 | 10/2002 | Knapp et al. |
| 6,477,019 B2 | 11/2002 | Matono et al. |
| 6,479,096 B1 | 11/2002 | Shi et al. |
| 6,483,662 B1 | 11/2002 | Thomas et al. |
| 6,487,040 B1 | 11/2002 | Hsiao et al. |
| 6,487,056 B1 | 11/2002 | Gibbons et al. |
| 6,490,125 B1 | 12/2002 | Barr |
| 6,496,330 B1 | 12/2002 | Crue, Jr. et al. |
| 6,496,334 B1 | 12/2002 | Pang et al. |
| 6,504,676 B1 | 1/2003 | Hiner et al. |
| 6,512,657 B2 | 1/2003 | Heist et al. |
| 6,512,659 B1 | 1/2003 | Hawwa et al. |
| 6,512,661 B1 | 1/2003 | Louis |
| 6,512,690 B1 | 1/2003 | Qi et al. |
| 6,515,573 B1 | 2/2003 | Dong et al. |
| 6,515,791 B1 | 2/2003 | Hawwa et al. |
| 6,532,823 B1 | 3/2003 | Knapp et al. |
| 6,535,363 B1 | 3/2003 | Hosomi et al. |
| 6,552,874 B1 | 4/2003 | Chen et al. |
| 6,552,928 B1 | 4/2003 | Qi et al. |
| 6,577,470 B1 | 6/2003 | Rumpler |
| 6,583,961 B2 | 6/2003 | Levi et al. |
| 6,583,968 B1 | 6/2003 | Scura et al. |
| 6,597,548 B1 | 7/2003 | Yamanaka et al. |
| 6,611,398 B1 | 8/2003 | Rumpler et al. |
| 6,618,223 B1 | 9/2003 | Chen et al. |
| 6,629,357 B1 | 10/2003 | Akoh |
| 6,633,464 B2 | 10/2003 | Lai et al. |
| 6,636,394 B1 | 10/2003 | Fukagawa et al. |
| 6,639,291 B1 | 10/2003 | Sin et al. |
| 6,650,503 B1 | 11/2003 | Chen et al. |
| 6,650,506 B1 | 11/2003 | Risse |
| 6,654,195 B1 | 11/2003 | Frank, Jr. et al. |
| 6,657,816 B1 | 12/2003 | Barr et al. |
| 6,661,621 B1 | 12/2003 | Iitsuka |
| 6,661,625 B1 | 12/2003 | Sin et al. |
| 6,674,610 B1 | 1/2004 | Thomas et al. |
| 6,680,863 B1 | 1/2004 | Shi et al. |
| 6,683,763 B1 | 1/2004 | Hiner et al. |
| 6,687,098 B1 | 2/2004 | Huai |
| 6,687,178 B1 | 2/2004 | Qi et al. |
| 6,687,977 B2 | 2/2004 | Knapp et al. |
| 6,691,226 B1 | 2/2004 | Frank, Jr. et al. |
| 6,697,294 B1 | 2/2004 | Qi et al. |
| 6,700,738 B1 | 3/2004 | Sin et al. |
| 6,700,759 B1 | 3/2004 | Knapp et al. |
| 6,704,158 B2 | 3/2004 | Hawwa et al. |
| 6,707,083 B1 | 3/2004 | Hiner et al. |
| 6,713,801 B1 | 3/2004 | Sin et al. |
| 6,721,138 B1 | 4/2004 | Chen et al. |
| 6,721,149 B1 | 4/2004 | Shi et al. |
| 6,721,203 B1 | 4/2004 | Qi et al. |
| 6,724,569 B1 | 4/2004 | Chen et al. |
| 6,724,572 B1 | 4/2004 | Stoev et al. |
| 6,729,015 B2 | 5/2004 | Matono et al. |
| 6,735,850 B1 | 5/2004 | Gibbons et al. |

(56) References Cited

U.S. PATENT DOCUMENTS

| | | |
|---|---|---|
| 6,737,281 B1 | 5/2004 | Dang et al. |
| 6,744,608 B1 | 6/2004 | Sin et al. |
| 6,747,301 B1 | 6/2004 | Hiner et al. |
| 6,751,055 B1 | 6/2004 | Alfoqaha et al. |
| 6,754,049 B1 | 6/2004 | Seagle et al. |
| 6,756,071 B1 | 6/2004 | Shi et al. |
| 6,757,140 B1 | 6/2004 | Hawwa |
| 6,760,196 B1 | 7/2004 | Niu et al. |
| 6,762,910 B1 | 7/2004 | Knapp et al. |
| 6,765,756 B1 | 7/2004 | Hong et al. |
| 6,775,902 B1 | 8/2004 | Huai et al. |
| 6,778,358 B1 | 8/2004 | Jiang et al. |
| 6,781,927 B1 | 8/2004 | Heanuc et al. |
| 6,785,955 B1 | 9/2004 | Chen et al. |
| 6,791,793 B1 | 9/2004 | Chen et al. |
| 6,791,807 B1 | 9/2004 | Hikami et al. |
| 6,798,616 B1 | 9/2004 | Seagle et al. |
| 6,798,625 B1 | 9/2004 | Ueno et al. |
| 6,801,408 B1 | 10/2004 | Chen et al. |
| 6,801,411 B1 | 10/2004 | Lederman et al. |
| 6,803,615 B1 | 10/2004 | Sin et al. |
| 6,806,035 B1 | 10/2004 | Atireklapvarodom et al. |
| 6,807,030 B1 | 10/2004 | Hawwa et al. |
| 6,807,332 B1 | 10/2004 | Hawwa |
| 6,809,899 B1 | 10/2004 | Chen et al. |
| 6,816,345 B1 | 11/2004 | Knapp et al. |
| 6,828,897 B1 | 12/2004 | Nepela |
| 6,829,160 B1 | 12/2004 | Qi et al. |
| 6,829,819 B1 | 12/2004 | Crue, Jr. et al. |
| 6,833,979 B1 | 12/2004 | Knapp et al. |
| 6,834,010 B1 | 12/2004 | Qi et al. |
| 6,859,343 B1 | 2/2005 | Alfoqaha et al. |
| 6,859,997 B1 | 3/2005 | Tong et al. |
| 6,861,937 B1 | 3/2005 | Feng et al. |
| 6,870,712 B2 | 3/2005 | Chen et al. |
| 6,873,494 B2 | 3/2005 | Chen et al. |
| 6,873,547 B1 | 3/2005 | Shi et al. |
| 6,879,464 B2 | 4/2005 | Sun et al. |
| 6,888,184 B1 | 5/2005 | Shi et al. |
| 6,888,704 B1 | 5/2005 | Diao et al. |
| 6,891,702 B1 | 5/2005 | Tang |
| 6,894,871 B2 | 5/2005 | Alfoqaha et al. |
| 6,894,877 B1 | 5/2005 | Crue, Jr. et al. |
| 6,906,894 B2 | 6/2005 | Chen et al. |
| 6,907,655 B2 * | 6/2005 | Pinarbasi .................. 29/603.14 |
| 6,909,578 B1 | 6/2005 | Missell et al. |
| 6,912,106 B1 | 6/2005 | Chen et al. |
| 6,934,113 B1 | 8/2005 | Chen |
| 6,934,129 B1 | 8/2005 | Zhang et al. |
| 6,940,688 B2 | 9/2005 | Jiang et al. |
| 6,942,824 B1 | 9/2005 | Li |
| 6,943,993 B2 | 9/2005 | Chang et al. |
| 6,944,938 B1 | 9/2005 | Crue, Jr. et al. |
| 6,947,258 B1 | 9/2005 | Li |
| 6,950,266 B1 | 9/2005 | McCaslin et al. |
| 6,954,332 B1 | 10/2005 | Hong et al. |
| 6,958,885 B1 | 10/2005 | Chen et al. |
| 6,961,221 B1 | 11/2005 | Niu et al. |
| 6,969,989 B1 | 11/2005 | Mei |
| 6,975,486 B2 | 12/2005 | Chen et al. |
| 6,987,643 B1 | 1/2006 | Seagle |
| 6,989,962 B1 | 1/2006 | Dong et al. |
| 6,989,972 B1 | 1/2006 | Stoev et al. |
| 7,006,327 B2 | 2/2006 | Krounbi et al. |
| 7,007,372 B1 | 3/2006 | Chen et al. |
| 7,012,832 B1 | 3/2006 | Sin et al. |
| 7,023,658 B1 | 4/2006 | Knapp et al. |
| 7,026,063 B2 | 4/2006 | Ueno et al. |
| 7,027,268 B1 | 4/2006 | Zhu et al. |
| 7,027,274 B1 | 4/2006 | Sin et al. |
| 7,035,046 B1 | 4/2006 | Young et al. |
| 7,041,985 B1 | 5/2006 | Wang et al. |
| 7,046,490 B1 | 5/2006 | Ueno et al. |
| 7,054,113 B1 | 5/2006 | Seagle et al. |
| 7,057,857 B1 | 6/2006 | Niu et al. |
| 7,059,868 B1 | 6/2006 | Yan |
| 7,092,195 B1 | 8/2006 | Liu et al. |
| 7,110,289 B1 | 9/2006 | Sin et al. |
| 7,111,382 B1 | 9/2006 | Knapp et al. |
| 7,113,366 B1 | 9/2006 | Wang et al. |
| 7,114,241 B2 | 10/2006 | Kubota et al. |
| 7,116,517 B1 | 10/2006 | He et al. |
| 7,124,654 B1 | 10/2006 | Davies et al. |
| 7,126,788 B1 | 10/2006 | Liu et al. |
| 7,126,790 B1 | 10/2006 | Liu et al. |
| 7,131,346 B1 | 11/2006 | Buttar et al. |
| 7,133,253 B1 | 11/2006 | Seagle et al. |
| 7,134,185 B1 | 11/2006 | Knapp et al. |
| 7,154,715 B2 | 12/2006 | Yamanaka et al. |
| 7,170,725 B1 | 1/2007 | Zhou et al. |
| 7,177,117 B1 | 2/2007 | Jiang et al. |
| 7,193,815 B1 | 3/2007 | Stoev et al. |
| 7,196,880 B1 | 3/2007 | Anderson et al. |
| 7,199,974 B1 | 4/2007 | Alfoqaha |
| 7,199,975 B1 | 4/2007 | Pan |
| 7,211,339 B1 | 5/2007 | Seagle et al. |
| 7,212,384 B1 | 5/2007 | Stoev et al. |
| 7,238,292 B1 | 7/2007 | He et al. |
| 7,239,478 B1 | 7/2007 | Sin et al. |
| 7,248,431 B1 | 7/2007 | Liu et al. |
| 7,248,433 B1 | 7/2007 | Stoev et al. |
| 7,248,449 B1 | 7/2007 | Seagle |
| 7,280,325 B1 | 10/2007 | Pan |
| 7,283,327 B1 | 10/2007 | Liu et al. |
| 7,284,316 B1 | 10/2007 | Huai et al. |
| 7,286,329 B1 | 10/2007 | Chen et al. |
| 7,289,303 B1 | 10/2007 | Sin et al. |
| 7,292,409 B1 | 11/2007 | Stoev et al. |
| 7,296,339 B1 | 11/2007 | Yang et al. |
| 7,307,814 B1 | 12/2007 | Seagle et al. |
| 7,307,818 B1 | 12/2007 | Park et al. |
| 7,310,204 B1 | 12/2007 | Stoev et al. |
| 7,318,947 B1 | 1/2008 | Park et al. |
| 7,333,295 B1 | 2/2008 | Medina et al. |
| 7,337,530 B1 | 3/2008 | Stoev et al. |
| 7,342,752 B1 | 3/2008 | Zhang et al. |
| 7,349,170 B1 | 3/2008 | Rudman et al. |
| 7,349,179 B1 | 3/2008 | He et al. |
| 7,354,664 B1 | 4/2008 | Jiang et al. |
| 7,363,697 B1 | 4/2008 | Dunn et al. |
| 7,371,152 B1 | 5/2008 | Newman |
| 7,372,665 B1 | 5/2008 | Stoev et al. |
| 7,375,926 B1 | 5/2008 | Stoev et al. |
| 7,379,269 B1 | 5/2008 | Krounbi et al. |
| 7,386,933 B1 | 6/2008 | Krounbi et al. |
| 7,389,577 B1 | 6/2008 | Shang et al. |
| 7,417,832 B1 | 8/2008 | Erickson et al. |
| 7,419,891 B1 | 9/2008 | Chen et al. |
| 7,428,124 B1 | 9/2008 | Song et al. |
| 7,430,098 B1 | 9/2008 | Song et al. |
| 7,436,620 B1 | 10/2008 | Kang et al. |
| 7,436,638 B1 | 10/2008 | Pan |
| 7,440,220 B1 | 10/2008 | Kang et al. |
| 7,443,632 B1 | 10/2008 | Stoev et al. |
| 7,444,740 B1 | 11/2008 | Chung et al. |
| 7,493,688 B1 | 2/2009 | Wang et al. |
| 7,508,627 B1 | 3/2009 | Zhang et al. |
| 7,522,377 B1 | 4/2009 | Jiang et al. |
| 7,522,379 B1 | 4/2009 | Krounbi et al. |
| 7,522,382 B1 | 4/2009 | Pan |
| 7,542,246 B1 | 6/2009 | Song et al. |
| 7,551,406 B1 | 6/2009 | Thomas et al. |
| 7,552,523 B1 | 6/2009 | He et al. |
| 7,554,767 B1 | 6/2009 | Hu et al. |
| 7,583,466 B2 | 9/2009 | Kermiche et al. |
| 7,595,967 B1 | 9/2009 | Moon et al. |
| 7,639,457 B1 | 12/2009 | Chen et al. |
| 7,660,080 B1 | 2/2010 | Liu et al. |
| 7,672,080 B1 | 3/2010 | Tang et al. |
| 7,672,086 B1 | 3/2010 | Jiang |
| 7,684,160 B1 | 3/2010 | Erickson et al. |
| 7,688,546 B1 | 3/2010 | Bai et al. |
| 7,691,434 B1 | 4/2010 | Zhang et al. |
| 7,695,761 B1 | 4/2010 | Shen et al. |

(56) References Cited

U.S. PATENT DOCUMENTS

| | | | |
|---|---|---|---|
| 7,719,795 B2 | 5/2010 | Hu et al. |
| 7,726,009 B1 | 6/2010 | Liu et al. |
| 7,729,086 B1 | 6/2010 | Song et al. |
| 7,729,087 B1 | 6/2010 | Stoev et al. |
| 7,736,823 B1 | 6/2010 | Wang et al. |
| 7,785,666 B1 | 8/2010 | Sun et al. |
| 7,796,356 B1 | 9/2010 | Fowler et al. |
| 7,800,858 B1 | 9/2010 | Bajikar et al. |
| 7,819,979 B1 | 10/2010 | Chen et al. |
| 7,829,264 B1 | 11/2010 | Wang et al. |
| 7,846,643 B1 | 12/2010 | Sun et al. |
| 7,855,854 B2 | 12/2010 | Hu et al. |
| 7,869,160 B1 | 1/2011 | Pan et al. |
| 7,872,824 B1 | 1/2011 | Macchioni et al. |
| 7,872,833 B2 | 1/2011 | Hu et al. |
| 7,910,267 B1 | 3/2011 | Zeng et al. |
| 7,911,735 B1 | 3/2011 | Sin et al. |
| 7,911,737 B1 | 3/2011 | Jiang et al. |
| 7,916,426 B2 | 3/2011 | Hu et al. |
| 7,918,013 B1 | 4/2011 | Dunn et al. |
| 7,968,219 B1 | 6/2011 | Jiang et al. |
| 7,982,989 B1 | 7/2011 | Shi et al. |
| 8,008,912 B1 | 8/2011 | Shang |
| 8,012,804 B1 | 9/2011 | Wang et al. |
| 8,015,692 B1 | 9/2011 | Zhang et al. |
| 8,018,677 B1 | 9/2011 | Chung et al. |
| 8,018,678 B1 | 9/2011 | Zhang et al. |
| 8,024,748 B1 | 9/2011 | Moravec et al. |
| 8,072,705 B1 | 12/2011 | Wang et al. |
| 8,074,345 B1 | 12/2011 | Anguelouch et al. |
| 8,077,418 B1 | 12/2011 | Hu et al. |
| 8,077,434 B1 | 12/2011 | Shen et al. |
| 8,077,435 B1 | 12/2011 | Liu et al. |
| 8,077,557 B1 | 12/2011 | Hu et al. |
| 8,079,135 B1 | 12/2011 | Shen et al. |
| 8,081,403 B1 | 12/2011 | Chen et al. |
| 8,091,210 B1 | 1/2012 | Sasaki et al. |
| 8,097,846 B1 | 1/2012 | Anguelouch et al. |
| 8,104,166 B1 | 1/2012 | Zhang et al. |
| 8,116,043 B2 | 2/2012 | Leng et al. |
| 8,116,171 B1 | 2/2012 | Lee |
| 8,125,856 B1 | 2/2012 | Li et al. |
| 8,134,794 B1 | 3/2012 | Wang |
| 8,136,224 B1 | 3/2012 | Sun et al. |
| 8,136,225 B1 | 3/2012 | Zhang et al. |
| 8,136,805 B1 | 3/2012 | Lee |
| 8,141,235 B1 | 3/2012 | Zhang |
| 8,146,236 B1 | 4/2012 | Luo et al. |
| 8,149,536 B1 | 4/2012 | Yang et al. |
| 8,151,441 B1 | 4/2012 | Rudy et al. |
| 8,163,185 B1 | 4/2012 | Sun et al. |
| 8,164,760 B2 | 4/2012 | Willis |
| 8,164,855 B1 | 4/2012 | Gibbons et al. |
| 8,164,864 B2 | 4/2012 | Kaiser et al. |
| 8,165,709 B1 | 4/2012 | Rudy |
| 8,166,631 B1 | 5/2012 | Tran et al. |
| 8,166,632 B1 | 5/2012 | Zhang et al. |
| 8,169,473 B1 | 5/2012 | Yu et al. |
| 8,171,618 B1 | 5/2012 | Wang et al. |
| 8,179,636 B1 | 5/2012 | Bai et al. |
| 8,191,237 B1 | 6/2012 | Luo et al. |
| 8,194,365 B1 | 6/2012 | Leng et al. |
| 8,194,366 B1 | 6/2012 | Li et al. |
| 8,196,285 B1 | 6/2012 | Zhang et al. |
| 8,200,054 B1 | 6/2012 | Li et al. |
| 8,203,800 B2 | 6/2012 | Li et al. |
| 8,208,350 B1 | 6/2012 | Hu et al. |
| 8,220,140 B1 | 7/2012 | Wang et al. |
| 8,222,599 B1 | 7/2012 | Chien |
| 8,225,488 B1 | 7/2012 | Zhang et al. |
| 8,227,023 B1 | 7/2012 | Liu et al. |
| 8,228,633 B1 | 7/2012 | Tran et al. |
| 8,231,796 B1 | 7/2012 | Li et al. |
| 8,233,248 B1 | 7/2012 | Li et al. |
| 8,248,896 B1 | 8/2012 | Yuan et al. |
| 8,254,060 B1 | 8/2012 | Shi et al. |
| 8,257,597 B1 | 9/2012 | Guan et al. |
| 8,259,410 B1 | 9/2012 | Bai et al. |
| 8,259,539 B1 | 9/2012 | Hu et al. |
| 8,262,918 B1 | 9/2012 | Li et al. |
| 8,262,919 B1 | 9/2012 | Luo et al. |
| 8,264,797 B2 | 9/2012 | Emley |
| 8,264,798 B1 | 9/2012 | Guan et al. |
| 8,270,126 B1 | 9/2012 | Roy et al. |
| 8,276,258 B1 | 10/2012 | Tran et al. |
| 8,277,669 B1 | 10/2012 | Chen et al. |
| 8,279,719 B1 | 10/2012 | Hu et al. |
| 8,284,517 B1 | 10/2012 | Sun et al. |
| 8,288,204 B1 | 10/2012 | Wang et al. |
| 8,289,821 B1 | 10/2012 | Huber |
| 8,291,743 B1 | 10/2012 | Shi et al. |
| 8,307,539 B1 | 11/2012 | Rudy et al. |
| 8,307,540 B1 | 11/2012 | Tran et al. |
| 8,308,921 B1 | 11/2012 | Hiner et al. |
| 8,310,785 B1 | 11/2012 | Zhang et al. |
| 8,310,901 B1 | 11/2012 | Batra et al. |
| 8,315,019 B1 | 11/2012 | Mao et al. |
| 8,316,527 B2 | 11/2012 | Hong et al. |
| 8,320,076 B1 | 11/2012 | Shen et al. |
| 8,320,077 B1 | 11/2012 | Tang et al. |
| 8,320,219 B1 | 11/2012 | Wolf et al. |
| 8,320,220 B1 | 11/2012 | Yuan et al. |
| 8,320,722 B1 | 11/2012 | Yuan et al. |
| 8,322,022 B1 | 12/2012 | Yi et al. |
| 8,322,023 B1 | 12/2012 | Zeng et al. |
| 8,325,569 B1 | 12/2012 | Shi et al. |
| 8,333,008 B1 | 12/2012 | Sin et al. |
| 8,334,093 B2 | 12/2012 | Zhang et al. |
| 8,336,194 B2 | 12/2012 | Yuan et al. |
| 8,339,738 B1 | 12/2012 | Tran et al. |
| 8,341,826 B1 | 1/2013 | Jiang et al. |
| 8,343,319 B1 | 1/2013 | Li et al. |
| 8,343,364 B1 | 1/2013 | Gao et al. |
| 8,349,195 B1 | 1/2013 | Si et al. |
| 8,351,307 B1 | 1/2013 | Wolf et al. |
| 8,357,244 B1 | 1/2013 | Zhao et al. |
| 8,373,945 B1 | 2/2013 | Luo et al. |
| 8,375,564 B1 | 2/2013 | Luo et al. |
| 8,375,565 B2 | 2/2013 | Hu et al. |
| 8,378,438 B2 * | 2/2013 | Apalkov et al. ............... 257/421 |
| 8,381,391 B2 | 2/2013 | Park et al. |
| 8,385,157 B1 | 2/2013 | Champion et al. |
| 8,385,158 B1 | 2/2013 | Hu et al. |
| 8,394,280 B1 | 3/2013 | Wan et al. |
| 8,400,731 B1 | 3/2013 | Li et al. |
| 8,404,128 B1 | 3/2013 | Zhang et al. |
| 8,404,129 B1 | 3/2013 | Luo et al. |
| 8,405,930 B1 | 3/2013 | Li et al. |
| 8,409,453 B1 | 4/2013 | Jiang et al. |
| 8,413,317 B1 | 4/2013 | Wan et al. |
| 8,416,540 B1 | 4/2013 | Li et al. |
| 8,419,953 B1 | 4/2013 | Su et al. |
| 8,419,954 B1 | 4/2013 | Chen et al. |
| 8,422,176 B1 | 4/2013 | Leng et al. |
| 8,422,342 B1 | 4/2013 | Lee |
| 8,422,841 B1 | 4/2013 | Shi et al. |
| 8,424,192 B1 | 4/2013 | Yang et al. |
| 8,441,756 B1 | 5/2013 | Sun et al. |
| 8,443,510 B1 | 5/2013 | Shi et al. |
| 8,444,866 B1 | 5/2013 | Guan et al. |
| 8,449,948 B2 | 5/2013 | Medina et al. |
| 8,451,556 B1 | 5/2013 | Wang et al. |
| 8,451,563 B1 | 5/2013 | Zhang et al. |
| 8,454,846 B1 | 6/2013 | Zhou et al. |
| 8,455,119 B1 | 6/2013 | Jiang et al. |
| 8,456,961 B1 | 6/2013 | Wang et al. |
| 8,456,963 B1 | 6/2013 | Hu et al. |
| 8,456,964 B1 | 6/2013 | Yuan et al. |
| 8,456,966 B1 | 6/2013 | Shi et al. |
| 8,456,967 B1 | 6/2013 | Mallary |
| 8,458,892 B2 | 6/2013 | Si et al. |
| 8,462,592 B1 | 6/2013 | Wolf et al. |
| 8,468,682 B1 | 6/2013 | Zhang |
| 8,472,288 B1 | 6/2013 | Wolf et al. |

(56) References Cited

U.S. PATENT DOCUMENTS

| | | |
|---|---|---|
| 8,480,911 B1 | 7/2013 | Osugi et al. |
| 8,486,285 B2 | 7/2013 | Zhou et al. |
| 8,486,286 B1 | 7/2013 | Gao et al. |
| 8,488,272 B1 | 7/2013 | Tran et al. |
| 8,491,801 B1 | 7/2013 | Tanner et al. |
| 8,491,802 B1 | 7/2013 | Gao et al. |
| 8,493,693 B1 | 7/2013 | Zheng et al. |
| 8,493,695 B1 | 7/2013 | Kaiser et al. |
| 8,495,813 B1 | 7/2013 | Hu et al. |
| 8,498,084 B1 | 7/2013 | Leng et al. |
| 8,506,828 B1 | 8/2013 | Osugi et al. |
| 8,514,517 B1 | 8/2013 | Batra et al. |
| 8,518,279 B1 | 8/2013 | Wang et al. |
| 8,518,832 B1 | 8/2013 | Yang et al. |
| 8,520,336 B1 | 8/2013 | Liu et al. |
| 8,520,337 B1 | 8/2013 | Liu et al. |
| 8,524,068 B2 | 9/2013 | Medina et al. |
| 8,526,275 B1 | 9/2013 | Yuan et al. |
| 8,531,801 B1 * | 9/2013 | Xiao et al. ............... 360/319 |
| 8,532,450 B1 | 9/2013 | Wang et al. |
| 8,533,937 B1 | 9/2013 | Wang et al. |
| 8,537,494 B1 | 9/2013 | Pan et al. |
| 8,537,495 B1 | 9/2013 | Luo et al. |
| 8,537,502 B1 | 9/2013 | Park et al. |
| 8,545,999 B1 | 10/2013 | Leng et al. |
| 8,547,659 B1 | 10/2013 | Bai et al. |
| 8,547,667 B1 | 10/2013 | Roy et al. |
| 8,547,730 B1 | 10/2013 | Shen et al. |
| 8,555,486 B1 | 10/2013 | Medina et al. |
| 8,559,141 B1 | 10/2013 | Pakala et al. |
| 8,563,146 B1 | 10/2013 | Zhang et al. |
| 8,565,049 B1 | 10/2013 | Tanner et al. |
| 8,576,517 B1 | 11/2013 | Tran et al. |
| 8,578,594 B2 | 11/2013 | Jiang et al. |
| 8,582,238 B1 | 11/2013 | Liu et al. |
| 8,582,241 B1 | 11/2013 | Yu et al. |
| 8,582,253 B1 | 11/2013 | Zheng et al. |
| 8,588,039 B1 | 11/2013 | Shi et al. |
| 8,593,914 B2 | 11/2013 | Wang et al. |
| 8,597,528 B1 | 12/2013 | Roy et al. |
| 8,599,520 B1 | 12/2013 | Liu et al. |
| 8,599,657 B1 | 12/2013 | Lee |
| 8,603,593 B1 | 12/2013 | Roy et al. |
| 8,607,438 B1 | 12/2013 | Gao et al. |
| 8,607,439 B1 | 12/2013 | Wang et al. |
| 8,611,035 B1 | 12/2013 | Bajikar et al. |
| 8,611,054 B1 | 12/2013 | Shang et al. |
| 8,611,055 B1 | 12/2013 | Pakala et al. |
| 8,614,864 B1 | 12/2013 | Hong et al. |
| 8,619,512 B1 | 12/2013 | Yuan et al. |
| 8,625,233 B1 | 1/2014 | Ji et al. |
| 8,625,941 B1 | 1/2014 | Shi et al. |
| 8,628,672 B1 | 1/2014 | Si et al. |
| 8,630,068 B1 | 1/2014 | Mauri et al. |
| 8,634,280 B1 | 1/2014 | Wang et al. |
| 8,638,529 B1 | 1/2014 | Leng et al. |
| 8,643,980 B1 | 2/2014 | Fowler et al. |
| 8,649,123 B1 | 2/2014 | Zhang et al. |
| 8,665,561 B1 | 3/2014 | Knutson et al. |
| 8,670,211 B1 | 3/2014 | Sun et al. |
| 8,670,213 B1 | 3/2014 | Zeng et al. |
| 8,670,214 B1 | 3/2014 | Knutson et al. |
| 8,670,294 B1 | 3/2014 | Shi et al. |
| 8,670,295 B1 | 3/2014 | Hu et al. |
| 8,675,318 B1 | 3/2014 | Ho et al. |
| 8,675,455 B1 | 3/2014 | Krichevsky et al. |
| 8,681,594 B1 | 3/2014 | Shi et al. |
| 8,689,430 B1 | 4/2014 | Chen et al. |
| 8,693,141 B1 | 4/2014 | Elliott et al. |
| 8,703,397 B1 | 4/2014 | Zeng et al. |
| 8,705,205 B1 | 4/2014 | Li et al. |
| 8,711,518 B1 | 4/2014 | Zeng et al. |
| 8,711,528 B1 | 4/2014 | Xiao et al. |
| 8,717,709 B1 | 5/2014 | Shi et al. |
| 8,720,044 B1 | 5/2014 | Tran et al. |
| 8,721,902 B1 | 5/2014 | Wang et al. |
| 8,724,259 B1 | 5/2014 | Liu et al. |
| 8,749,790 B1 | 6/2014 | Tanner et al. |
| 8,749,920 B1 | 6/2014 | Knutson et al. |
| 8,753,903 B1 | 6/2014 | Tanner et al. |
| 8,760,807 B1 | 6/2014 | Zhang et al. |
| 8,760,818 B1 | 6/2014 | Diao et al. |
| 8,760,819 B1 | 6/2014 | Liu et al. |
| 8,760,822 B1 | 6/2014 | Li et al. |
| 8,760,823 B1 | 6/2014 | Chen et al. |
| 8,763,235 B1 | 7/2014 | Wang et al. |
| 8,780,498 B1 | 7/2014 | Jiang et al. |
| 8,780,505 B1 | 7/2014 | Xiao |
| 8,786,983 B1 | 7/2014 | Liu et al. |
| 8,790,524 B1 | 7/2014 | Luo et al. |
| 8,790,527 B1 | 7/2014 | Luo et al. |
| 8,792,208 B1 | 7/2014 | Liu et al. |
| 8,792,312 B1 | 7/2014 | Wang et al. |
| 8,793,866 B1 | 8/2014 | Zhang et al. |
| 8,797,680 B1 | 8/2014 | Luo et al. |
| 8,797,684 B1 | 8/2014 | Tran et al. |
| 8,797,686 B1 | 8/2014 | Bai et al. |
| 8,797,692 B1 | 8/2014 | Guo et al. |
| 8,813,324 B2 | 8/2014 | Emley et al. |
| 2005/0180060 A1 * | 8/2005 | Gill ..................... 360/324.12 |
| 2006/0119989 A1 * | 6/2006 | Seyama et al. ............. 360/324.1 |
| 2008/0113220 A1 * | 5/2008 | Sun et al. ................... 428/800 |
| 2009/0122450 A1 * | 5/2009 | Wang et al. ............. 360/324.2 |
| 2009/0269617 A1 * | 10/2009 | Zhang et al. .............. 428/811.1 |
| 2010/0073828 A1 | 3/2010 | Wang et al. |
| 2010/0247967 A1 * | 9/2010 | Huai et al. .................. 428/812 |
| 2010/0290157 A1 | 11/2010 | Zhang et al. |
| 2011/0031569 A1 * | 2/2011 | Watts et al. ................. 257/421 |
| 2011/0032644 A1 * | 2/2011 | Watts et al. ............. 360/324.12 |
| 2011/0086240 A1 | 4/2011 | Xiang et al. |
| 2012/0111826 A1 | 5/2012 | Chen et al. |
| 2012/0216378 A1 | 8/2012 | Emley et al. |
| 2012/0237878 A1 | 9/2012 | Zeng et al. |
| 2012/0298621 A1 | 11/2012 | Gao |
| 2012/0313191 A1 | 12/2012 | Whig et al. |
| 2013/0216702 A1 | 8/2013 | Kaiser et al. |
| 2013/0216863 A1 | 8/2013 | Li et al. |
| 2013/0257421 A1 | 10/2013 | Shang et al. |
| 2014/0154529 A1 | 6/2014 | Yang et al. |
| 2014/0175050 A1 | 6/2014 | Zhang et al. |

* cited by examiner

130'

| Capping Layer | 138 |
| Ferromagnetic Layer → | 150 |
| NM Layer 148 | |
| Ferromagnetic Layer → | 146 |
| NM Layer 144 | |
| Ferromagnetic Layer → | 142 |
| NM Layer 152 | |
| Ferromagnetic Layer → | 154 |
| Ferromagnetic Layer → | 160 |
| NM Spacer/Barrier Layer | 136 |
| Pinned Layer | 134 |
| Opt'l Pinning/AFM Layer | 132 |
| Seed Layer(s) | 131 |

140' brackets layers 142–160

FIG. 5

MAGNETIC RECORDING READ TRANSDUCER HAVING A LAMINATED FREE LAYER

BACKGROUND

FIG. 1 depicts an air-bearing surface (ABS) view of a conventional read transducer 10. The conventional read transducer 10 includes shields 12 and 20, sensor 14 and magnetic bias structures 19. The read sensor 14 is typically a giant magnetoresistive (GMR) sensor or tunneling magnetoresistive (TMR) sensor. The read sensor 14 includes an antiferromagnetic (AFM) layer 18, a pinned layer 17, a nonmagnetic spacer layer 16, and a free layer 15. Also shown is a capping layer. In addition, seed layer(s) may be used.

The pinned layer 17 and free layer 15 are magnetic. The pinned layer 17 may be a single layer or a multilayer. The magnetic moment of the pinned layer is fixed, or pinned, in place by an exchange interaction with the AFM layer 18. The free layer 15 has a magnetization sensitive to an external magnetic field. Thus, the free layer 15 functions as a sensor layer for the magnetoresistive sensor 14. These magnetic bias structures 19 are used to magnetically bias the free layer 15 of the sensor 14. The conventional free layer 15 consists of a multilayer. The layers of the free layer 15 are selected for various purposes. For example, the free layer may include a CoFe layer, NiFe layer and/or other layers. These layers are desired to be selected for, among other purposes, a high magnetoresistance.

Although conventional free layer 15 may function, there are drawbacks. For example, the root mean square variation in the asymmetry (asymmetry a) may be larger than desired. The asymmetry σ may depend upon the material(s) used, the topology of the shield 20 and/or other factors. For example, certain materials such as CoB, which may be desirable for higher magnetoresistance, may exhibit an asymmetry sigma that is larger than desired. As a result, a CoB free layer may not be used for the conventional free layer 15. The conventional free layer 15 may thus have a reduced magnetoresistance or a reduced yield during fabrication due to a large asymmetry a.

Accordingly, what is needed is a system and method for improving the performance of a magnetic recording read transducer.

BRIEF DESCRIPTION OF SEVERAL VIEWS OF THE DRAWINGS

FIG. 5 depicts another exemplary embodiment of a portion of a magnetic recording read transducer.

DETAILED DESCRIPTION OF THE PREFERRED EMBODIMENTS

Figure 1:
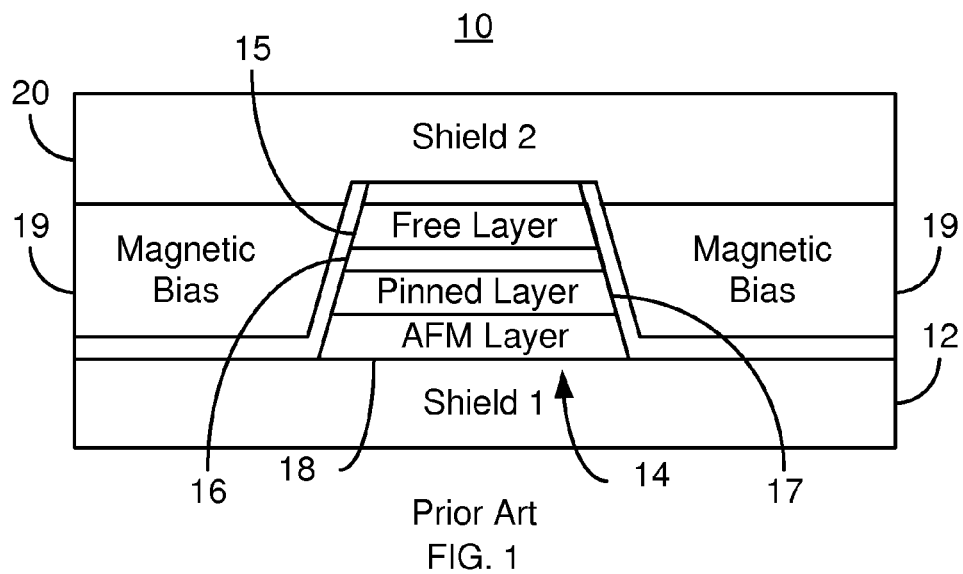
FIG. 1 depicts a conventional read transducer.
Figure 2:
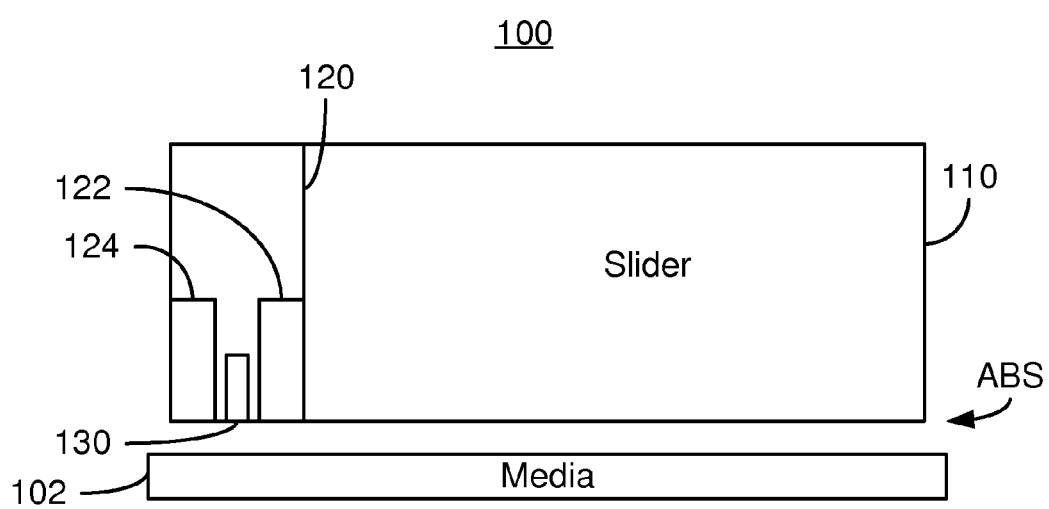
FIG. 2 depicts a side view of an exemplary embodiment of a magnetic recording disk drive.
Figure 3:
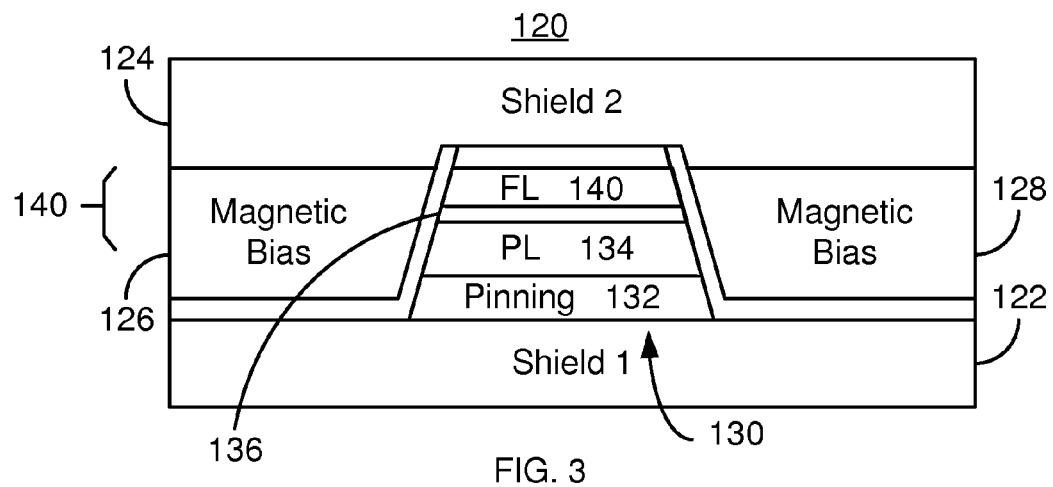
FIG. 3 is an ABS view of an exemplary embodiment of a portion of a magnetic recording read transducer.
Figure 4:
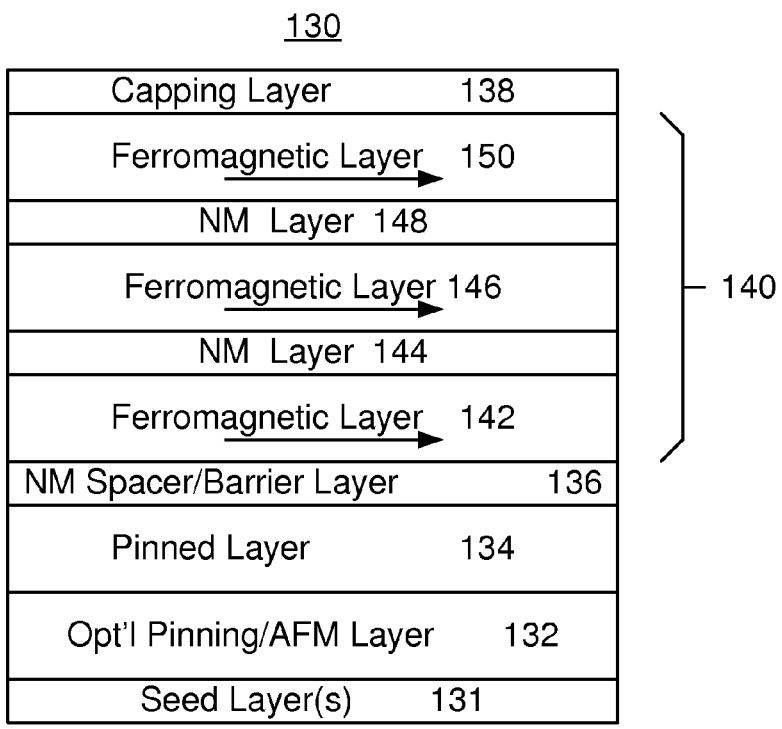
FIG. 4 depicts an ABS view of another exemplary embodiment of a portion of a magnetic recording read transducer.

FIG. 2 depicts a side view of an exemplary embodiment of a portion of a magnetic recording disk drive 100. FIG. 3 depicts an ABS view of an exemplary embodiment of a portion of the read transducer 120 that may be part of the magnetic recording disk drive 100. FIG. 4 depicts a portion of the read sensor 130. For clarity, FIGS. 2-4 are not to scale. For simplicity not all portions of the disk drive 100 are shown. In addition, although the disk drive 100 is depicted in the context of particular components other and/or different components may be used. For simplicity, only single components 102, 110, 120, 122, 124 and 130 are shown. However, multiples of each components 102, 110, 120, 122, 124 and/or 130 and their sub-components, might be used.

The disk drive 100 includes media 102, a slider 110, and a read transducer 120. Additional and/or different components may be included in the disk drive 100. For example, a write transducer (not shown) is generally also included. Thus, the slider 110 includes a merged head. The slider 110, and thus the transducer 120 are generally attached to a suspension (not shown). The transducer 120 is fabricated on the slider 110 and includes an air-bearing surface (ABS) proximate to the media 102 during use.

The read transducer 120 includes a first shield 122, a second shield 124 and a read sensor 130. The shields 122 and 124 may include soft magnetic material(s) such as NiFe. In other embodiments, the shield(s) 122 and/or 124 may be antiferromagnetically biased shield(s). The read sensor 130 is between the shields 122 and 124. Although shown as separated in FIG. 2, in some embodiments, the read sensor 130 is electrically connected to the shields 122 and 124. Such an embodiment is shown in FIG. 3. In addition, the read transducer 120 includes magnetic bias structures 126 and 128. The magnetic bias structures 126 and 128 may be soft, hard or other bias structures. The magnetic bias structures 126 and 128 are adjacent to the read sensor 130 and between the shields 122 and 124. In some embodiments, the magnetic bias structures 126 and 128 adjoin the read sensor 130. However, in the embodiment shown, the magnetic bias structures 126 and 128 are separated from the read sensor 130 by a thin layer that may be an insulating layer.

The read sensor 130 includes an optional pinning or antiferromagnetic layer 132, a pinned layer 134, a nonmagnetic spacer layer 136, a free layer 140 and an optional capping layer 138. The sensor 130 may include other layer(s) such as seed layer(s). Such an optional seed layer 131 is shown in FIG. 4. The nonmagnetic spacer layer 136 may include a conductor such as Cu, an insulating tunneling barrier layer such as MgO, or other material(s). The pinning layer 132 may be an AFM layer, such as IrMn. The pinned layer 134 and free layer 140 are ferromagnetic. The pinned layer 134 may have its magnetic moment pinned by the pinning layer 132. Alternatively, the pinned layer 134 may have its magnetic moment stabilized in another manner. The pinned layer 134 may be a single layer or a multilayer. For example, the pinned layer 134 may be a synthetic pinned layer include two antiferromagnetically coupled ferromagnetic layers separated by a nonmagnetic layer.

The free layer 140 includes multiple ferromagnetic layers that are interleaved with and sandwich nonmagnetic layers. Thus, the free layer 140 is shown as including ferromagnetic layers 142, 146 and 150 interleaved with and sandwiching nonmagnetic layers 144 and 148. Although shown as single layers, one or more of the layers 142, 146 and 150 may include substructures. For example, a ferromagnetic layer 142, 146 and/or 150 may include multiple ferromagnetic sublayers. The ferromagnetic layers 142, 146 and 150 may include at least one of CoB, CoFe, CoFeB, Co, Fe and NiFe. The ferromagnetic layers 142, 146 and 150 may all be formed of the same material or may include different material(s). For example, the layers 142 146 and 150 may all be CoB layers or the layers 142 and 146 may be CoFeB while the layer 150 is NiFe. Further, the thicknesses of the ferromagnetic layers 142, 146 and 150 may be the same or different. In some embodiments, the total thickness of the free layer 140 is at least fifty Angstroms and not more than seventy Angstroms. However, other thicknesses are possible. The nonmagnetic layers 144 and 148 may include one or more of Ru, Rh, Ir, Re, Mo, Nb, Ta, W, Cr, Ag, Au, Ti, V, MgO, Mg, Al, Cu and Si. The nonmagnetic layers 144 and 148 may all be formed of the same material or may be different. For example, the nonmagnetic layers 144 and 148 may both be Ru layers or one layer 144 or 148 may be a Ru layer while the other layer 148 may be Rh. Further, the thicknesses of the nonmagnetic layers 144 and 148 may be the same or different. In some embodiments, the free layer 140 may include additional layers not shown in FIGS. 2-4, such as CoFe and/or CoFeB layers. Although three ferromagnetic layers and two nonmagnetic layers are shown, another number may be used. For example, four ferromagnetic layers and three nonmagnetic layers may be present in the free layer 140. In some embodiments, at least three and not more than seven ferromagnetic layers are present. The ferromagnetic layers 142, 144 and 146 are ferromagnetically aligned. Thus, the magnetic moments, shown in FIG. 4 as arrows, point in the same direction.

In some embodiments, the magnetic moments of the ferromagnetic layers 142, 146 and 150 are ferromagnetically coupled. In such an embodiment, the alignment of the magnetic moments of the ferromagnetic layers 142, 146 and 140 may be due at least in part to this coupling across the nonmagnetic layers 144 and 148. However, this coupling may be weak because of the insertion of the nonmagnetic layers 144 and 148 between the ferromagnetic layers 142 and 146 and ferromagnetic layers 146 and 150, respectively. For example, the layers 142, 146 and 150 may be coupled via the Ruderman-Kittel-Kasuya-Yosida (RKKY) interaction. The RKKY interaction is an oscillating interaction that decreases with increasing distance between the ferromagnetic layers and can be ferromagnetic in nature, antiferromagnetic in nature, or zero (at the crossover between ferromagnetic and antiferromagnetic). In such an embodiment, the nonmagnetic layers 144 and 148 may be at least one and not more than seven Angstroms thick. In some such embodiments, the nonmagnetic layers 144 and 148 may be at least three Angstroms thick. For such embodiments, the ferromagnetic layers 142, 146 and 150 are weakly ferromagnetically coupled. For example, the coupling strength may be less than 1 erg/cm$^2$. In some embodiments, the coupling strength is and not more than 0.3 erg/cm$^2$ and may be on the order of 0.2 erg/cm$^2$.

In other embodiments, the ferromagnetic layers 142, 146 and 150 of the free layer 140 are magnetically uncoupled even though their moments are ferromagnetically aligned. As discussed above for the RKKY interaction, the coupling between the ferromagnetic layers 142, 146 and 150 may go to zero for some thicknesses of the nonmagnetic layers 144 and 148. Such thickness(es) may be used for the nonmagnetic layers 144 and 148. In other embodiments, other mechanism(s) for decoupling the ferromagnetic layers 142, 146 and 150 may be used. However, the ferromagnetic layers 142, 146 and 150 are still ferromagnetically aligned. This alignment may be due, for example, to the magnetic bias provided by the bias structures 126 and 128.

In still other embodiments, the ferromagnetic layers 142, 146 and 150 may be weakly antiferromagnetically coupled. This may occur due to the RKKY interaction and the selected thicknesses of the nonmagnetic layers 144 and 148. In other embodiments, other mechanism(s) for weakly antiferromagnetically coupling the layers 142, 146 and 150 may be used. However, the magnetic moments of the ferromagnetic layers 142, 146 and 150 are still ferromagnetically aligned. Again, this may be due to the bias provided by the magnetic bias structures 126 and 128. The magnetic layers 142, 146 and 150 of the free layer 140 are thus ferromagnetically aligned due to a weak ferromagnetic coupling or the bias provided by the structures 126 and 128 despite the layers 142, 146 and 150 being uncoupled or weakly antiferromagnetically coupled.

The magnetic transducer 120 may have improved performance. The read sensor 130 may have improved asymmetry a. It is believed that this improvement in the asymmetry σ is due to weak coupling/lack of coupling between the ferromagnetic layers 142, 146 and 150. For example, it is posited that the large asymmetry σ may be due to topology of the shield 124. If the shield 124 is not flat, variations in the topology may exert a magnetic field on the free layer 140. For example, a field may be exerted on the ferromagnetic layer 150 that would tend to tilt the magnetic moment away from the equilibrium position shown. If the ferromagnetic layers 142, 146 and 150 are strongly ferromagnetically coupled, a tilt in the magnetic moment of one layer 150 may result in the magnetic moments of all of the layers being rotated from their equilibrium positions. If, however, the ferromagnetic layers 142, 146 and 150 are weakly coupled or uncoupled, then the change in the direction of the moment of one layer 150 may not significantly affect the directions of the magnetic moments of the remaining layers 146 and 142. Thus, the asymmetry σ may be reduced. This reduction in the asymmetry σ may allow for a wider selection of materials. For example, CoB may be used in one or more of the ferromagnetic layers 142, 146 and 150 because the asymmetry σ issued may be mitigated by the design of the free layer 140. Thus, performance of the read sensor 130 may be further enhanced. Although they may be weakly magnetically coupled/uncoupled, the ferromagnetic layers 142, 144 and 146 still have their magnetic moments aligned. Thus, the sensor 130 may still have a sufficiently high magnetoresistance to provide the desired signal. In addition, by adjusting the number and spacing of the ferromagnetic layers 142, 146 and 150, the saturation magnetization of the free layer 140 may also be tailored. Thus, performance of the transducer 120 may be improved.

Although the reduction in asymmetry sigma is described in the context of a particular mechanism, functioning of the free layer 140 and sensor 130 is not dependent upon a particular physical mechanism. Thus, the free layer 140 may function even if there is no reduction in asymmetry σ or the reduction in asymmetry σ is due to another phenomenon.

In addition, it is noted that the free layer 140 is described in the context of all of the ferromagnetic layers 142, 146 and 150 being weakly ferromagnetically coupled, magnetically uncoupled, and/or weakly antiferromagnetically coupled while having their magnetic moments ferromagnetically aligned. In some embodiments, however, the layers 142 and 146 further from the shield 124 may be more strongly ferromagnetically coupled. However, the ferromagnetic layer 150 closest to the shield 124 may still be desired to be weakly ferromagnetically coupled, magnetically uncoupled, or weakly antiferromagnetically coupled with the remaining ferromagnetic layers 142 and 146 of the free layer. Such a difference in the coupling between a portion of the ferromagnetic layers 142, 146 and 150 may allow for the reduction in asymmetry σ without substantially changing the function of the remaining portion of the free layer. Thus, such a read sensor would enjoy benefits analogous to those described above.

The free layer 140 has been described in the context of multiple nonmagnetic layers 142 and 146 and multiple ferromagnetic layers 142, 146 and 150. However, in other embodiments, the free layer could include a single nonmagnetic layer between two ferromagnetic layers. For example, the free layer 140 might include ferromagnetic layers 142 and 146 separated by nonmagnetic layer 144 and omit the layers 148 and 150. In such an embodiment, the ferromagnetic layers 142 and 146 could be weakly ferromagnetically coupled through the nonmagnetic layer 144, magnetically uncoupled, or weakly antiferromagnetically coupled. For example, in such an embodiment, the ferromagnetic coupling between the layers 142 and 146 may be less than 0.3 erg/cm². The ferromagnetic layers 142 and 146 would still be ferromagnetically aligned. Such embodiments may enjoy the same benefits as the free layer 140 described above.

FIG. 5 depicts an ABS view of an exemplary embodiment of a portion of the read sensor 130' that may be part of the magnetic recording disk drive 100. The sensor 130' is thus analogous to the read sensor 130 depicted in FIGS. 2-4. For clarity, FIG. 5 is not to scale. For simplicity not all portions of the read sensor 130' are shown. In addition, although the read sensor 130' is depicted in the context of particular components other and/or different components may be used. For simplicity, only single components are shown. However, multiples of each components their sub-components, might be used. Further, analogous components to those depicted in FIGS. 2-4 are labeled similarly.

The read sensor 130' includes an optional seed layer 131, an optional pinning/AFM layer 132, a pinned layer 134, a nonmagnetic spacer (or barrier) layer 136 and a free layer 140' that are analogous to the optional seed layer 131, the optional pinning/AFM layer 132, the pinned layer 134, the nonmagnetic spacer (or barrier) layer 136 and the free layer 140. In the embodiment shown, the free layer includes ferromagnetic layers 142, 146, 150 and 154 interleaved with and sandwiching nonmagnetic layers 144, 148 and 152. The layers 142, 144, 146, 148 and 150 are analogous to those described above. An additional ferromagnetically aligned layer 154 and nonmagnetic layer 152 are shown. These layers are analogous to the layers 142 and 144. Thus, the free layer 140' still includes ferromagnetic layers 142, 146, 150 and 154 interleaved with and sandwiching nonmagnetic layers 144, 148 and 152. Further, the magnetic coupling (or lack thereof) and alignment is analogous to that described above for the sensor 130.

In addition, the free layer 140' may include an additional ferromagnetic layer 160 that adjoins the nonmagnetic spacer layer 136. Such an additional ferromagnetic layer 125 may be selected to enhance the magnetoresistance of the sensor 130'. For example, the ferromagnetic layer 160' may be a CoFe layer. Further, the ferromagnetic layer 160 may include sublayers.

The magnetic junction 130' may enjoy the benefits of the magnetic junction 130. Thus, asymmetry σ may be reduced. Further, because the materials selected for use in the free layer 140 may be less restricted based on asymmetry a, other properties of the free layer 140 may be improved. For example, the magnetoresistance of the sensor 130' may be improved and the saturation magnetization of the free layer 140' adjusted.

Figure 6:
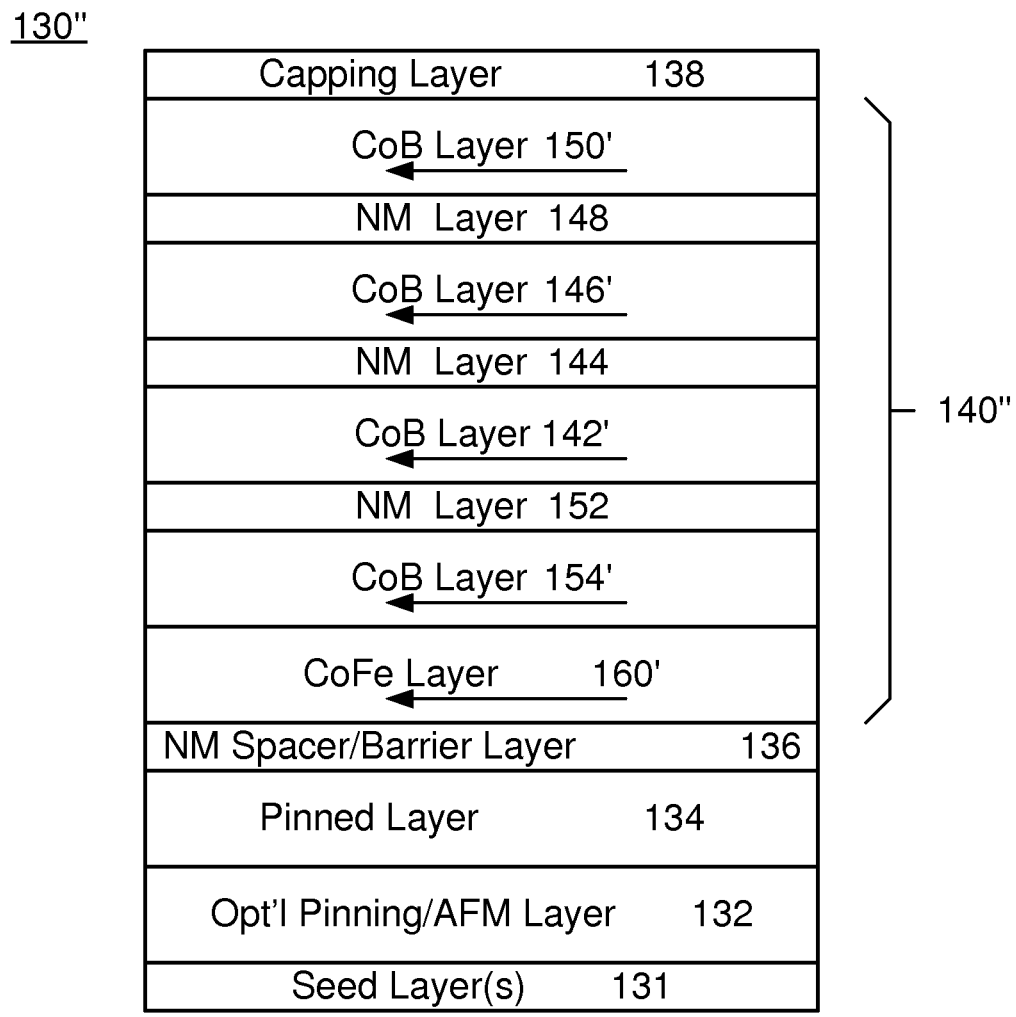
FIG. 6 depicts another exemplary embodiment of a portion of a magnetic recording read transducer.

FIG. 6 depicts an ABS view of an exemplary embodiment of a portion of the read sensor 130" that may be part of the magnetic recording disk drive 100. The sensor 130" is thus analogous to the read sensors 130 and/or 130' depicted in FIGS. 2-5. For clarity, FIG. 6 is not to scale. For simplicity not all portions of the read sensor 130" are shown. In addition, although the read sensor 130" is depicted in the context of particular components other and/or different components may be used. For simplicity, only single components are shown. However, multiples of each components their sub-components, might be used. Further, analogous components to those depicted in FIGS. 2-5 are labeled similarly.

The read sensor 130" includes an optional seed layer 131, an optional pinning/AFM layer 132, a pinned layer 134, a nonmagnetic spacer (or barrier) layer 136 and a free layer 140" that are analogous to the optional seed layer 131, the optional pinning/AFM layer 132, the pinned layer 134, the nonmagnetic spacer (or barrier) layer 136 and the free layer 140/140'. In the embodiment shown, the free layer includes ferromagnetic layers 142', 146', 150' and 154' interleaved with and sandwiching nonmagnetic layers 144, 148 and 152. The layers 142', 144, 146', 148, 150', 152 and 154' are analogous to the layers 142, 144, 146, 148, 150, 152 and 154 described above. The layers 142', 146', 150' and 154' are, however, explicitly shown as being CoB layers. Further, the magnetic coupling (or lack thereof), thickness, alignment and/or other properties may be analogous to those described above for the sensor(s) 130 and/or 130'. For example, although four ferromagnetic layers 142, 146, 150 and 154 are shown, another number may be used.

The free layer 140" may include an additional ferromagnetic layer 160' that adjoins the nonmagnetic spacer layer 136 and is analogous to the additional ferromagnetic layer 160. Such an additional ferromagnetic layer 160' may be selected to enhance the magnetoresistance and/or for other reasons. In the embodiment shown, the layer 160' is a CoFe layer. Such a layer may improve the magnetoresistance of the sensor 130".

The magnetic junction 130" may enjoy the benefits of the magnetic junction(s) 130 and/or 130'. Thus, asymmetry σ may be reduced. It is believed that this is due to the weak ferromagnetic coupling between the layers 142', 146', 150' and 154'. Further, because the materials selected for use in the free layer 140 may be less restricted based on asymmetry a, CoB may be used for the layers 142', 146', 150' and/or 154'. Thus, the magnetoresistance of the sensor 130" may be improved and the saturation magnetization of the free layer 140" tailored.

Figure 7:
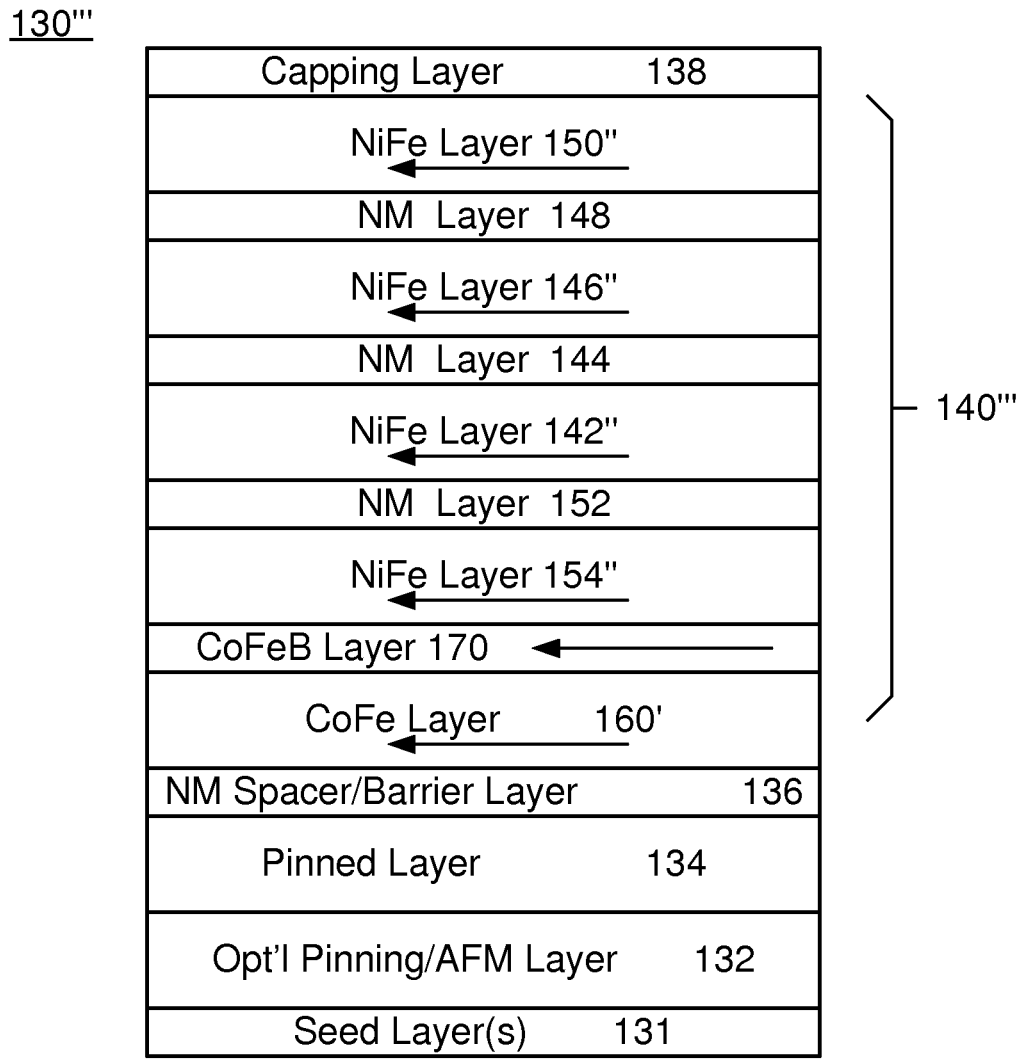
FIG. 7 depicts another exemplary embodiment of a portion of a magnetic recording read transducer.

FIG. 7 depicts an ABS view of an exemplary embodiment of a portion of the read sensor 130''' that may be part of the magnetic recording disk drive 100. The sensor 130''' is thus analogous to the read sensors 130, 130' and/or 130" depicted in FIGS. 2-6. For clarity, FIG. 7 is not to scale. For simplicity not all portions of the read sensor 130''' are shown. In addition, although the read sensor 130''' is depicted in the context of particular components other and/or different components may be used. For simplicity, only single components are shown. However, multiples of each components their sub-components, might be used. Further, analogous components to those depicted in FIGS. 2-6 are labeled similarly.

The read sensor 130''' includes an optional seed layer 131, an optional pinning/AFM layer 132, a pinned layer 134, a nonmagnetic spacer (or barrier) layer 136 and a free layer 140''' that are analogous to the optional seed layer 131, the optional pinning/AFM layer 132, the pinned layer 134, the nonmagnetic spacer (or barrier) layer 136 and the free layer 140/140'/140". In the embodiment shown, the free layer includes ferromagnetic layers 142", 146", 150" and 154" interleaved with and sandwiching nonmagnetic layers 144, 148 and 152. The layers 142", 144, 146", 148, 150", 152 and 154" are analogous to the layers 142/142', 144, 146/146', 148, 150/150', 152 and 154/154', respectively, described above. The layers 142", 146", 150" and 154" are, however, explicitly shown as being NiFe layers. Further, the magnetic coupling (or lack thereof), thickness, alignment and/or other properties may be analogous to those described above for the sensor(s) 130 and/or 130'.

The free layer 140''' may include an additional ferromagnetic layer 160'' that adjoins the nonmagnetic spacer layer 136 and is analogous to the additional ferromagnetic layer 160/160'. Such an additional ferromagnetic layer 160'' may be selected to enhance the magnetoresistance and/or for other reasons. In the embodiment shown, the layer 160'' is a CoFe layer, which may improve the magnetoresistance of the sensor 130''. The free layer 140'' is also depicted as including an additional CoFeB layer 170 between the CoFe layer 160' and the first NiFe layer 154''.

The magnetic junction 130''' may enjoy the benefits of the magnetic junction(s) 130, 130' and/or 130''. Thus, asymmetry σ may be reduced. It is believed that this is due to the weak ferromagnetic coupling between the layers 142'', 146'', 150'' and 154''. Further, because the materials selected for use in the free layer 140 may be less restricted based on asymmetry a, the layers 142'', 146'', 150'' and/or 154'' may have improved increased magnetoresistance. Thus, the magnetoresistance of the sensor 130'' may be improved and the saturation magnetization of the free layer 140''' tailored.

Figure 8:
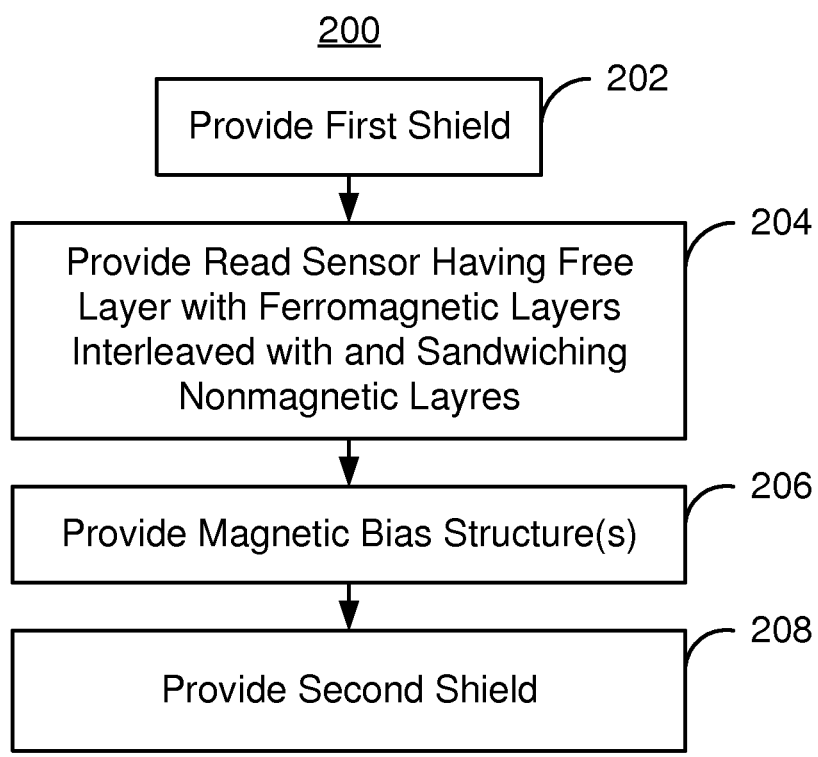
FIG. 8 is flow chart depicting an exemplary embodiment of a method for fabricating a magnetic recording read transducer.

FIG. 8 is an exemplary embodiment of a method 200 for providing a read transducer including a free layer such as the free layer 140, 140', 140'' and/or 140'''. For simplicity, some steps may be omitted, interleaved, and/or combined. The method 200 is also described in the context of providing a single recording transducer 120 and free layer 140 depicted in FIGS. 2-4. However, the method 200 may be used to fabricate multiple transducers at substantially the same time. The method 200 may also be used to fabricate other transducers and other free layers including but not limited to any combination of the free layers 140, 140', 140'' and/or 140'''. The method 200 is also described in the context of particular layers. A particular layer may include multiple materials and/or multiple sub-layers. The method 200 also may start after formation of other portions of the magnetic recording transducer.

The first shield 122 is provided, via step 202. Step 202 typically includes depositing a large high permeability layer. The read sensor 130 is provided, via step 204. Step 204 typically includes depositing the layers for the sensor 130, then defining the sensor 130 in at least the track width direction using an ion mill. More specifically, step 204 includes providing a read sensor 130 including a free layer 140 including a plurality of ferromagnetic layers interleaved with and sandwiching nonmagnetic layers and in which the ferromagnetic layers are ferromagnetically aligned. In addition, the ferromagnetic layers are weakly ferromagnetically coupled, weakly antiferromagnetically coupled or uncoupled. Step 204 may also provide sensor(s) 130', 130'' and/or 130'''. The magnetic bias structures 126 and 128 are provided, via step 206. The shield 124 is provided in step 208. Thus, the benefits of the disk drive 100, the magnetic transducer 120, sensor 130/130'/130''/130''' and free layer(s) 140, 140', 140'' and/or 140''' may be achieved.

We claim:

1. A magnetic transducer having an air-bearing surface (ABS) and comprising:
   a first shield;
   a second shield; and
   a read sensor between the first shield and the second shield, the read sensor including a pinned layer, a nonmagnetic spacer layer and a free layer, the nonmagnetic spacer layer being between the pinned layer and the free layer, the free layer including a plurality of ferromagnetic layers interleaved with and sandwiching a plurality of nonmagnetic layers, the plurality of ferromagnetic layers being ferromagnetically aligned, the plurality of ferromagnetic layers consisting of a single material, the plurality of ferromagnetic layers being a plurality of CoB layers.

2. The magnetic transducer of claim 1 wherein the free layer further includes an additional magnetic layer between the nonmagnetic spacer layer and a magnetic layer of the plurality of magnetic layers.

3. The magnetic transducer of claim 2 wherein the additional magnetic layer includes CoFe.

4. The magnetic transducer of claim 1 wherein at least one of the plurality of ferromagnetic layers includes ferromagnetic sublayers.

5. The magnetic transducer of claim 1 wherein the plurality of ferromagnetic layers are ferromagnetically coupled through the plurality of nonmagnetic layers via a Ruderman-Kittel-Kasuya-Yosida (RKKY) interaction.

6. The magnetic transducer of claim 1 wherein each of the plurality of nonmagnetic layers has a thickness of at least one and not more than seven Angstroms.

7. The magnetic transducer of claim 6 wherein the thickness is at least three Angstroms.

8. The magnetic transducer of claim 1 wherein the plurality of CoB layers includes at least four and not more than seven CoB layers.

9. The magnetic transducer of claim 1 wherein the plurality of nonmagnetic layers includes at least one of Re, Mo, Nb, W, Cr, Ag, Au, V, MgO, Mg, Al, Cu and Si.

10. The magnetic transducer of claim 9 wherein the plurality of nonmagnetic layers are selected from a plurality of Re layers, a plurality of Mo layers, a plurality of Nb layers, a plurality of W layers, a plurality of Cr layers, a plurality of Ag layers, a plurality of Au layers, a plurality of V layers, a plurality of MgO layers, a plurality of Mg layers, a plurality of Al layers, a plurality of Cu layers and a plurality of Si layers.

11. The magnetic transducer of claim 1 wherein the plurality of ferromagnetic layers are ferromagnetically aligned and antiferromagnetically coupled or magnetically uncoupled.

12. The magnetic transducer of claim 1 wherein the plurality of ferromagnetic layers includes a first ferromagnetic layer furthest from the nonmagnetic spacer layer, the first ferromagnetic layer being more weakly coupled to the remaining portion of the plurality of ferromagnetic layers, than the remaining portion of the plurality of ferromagnetic layers are coupled with each other.

13. A magnetic transducer having an air-bearing surface (ABS) and comprising:
   a first shield;
   a second shield; and
   a read sensor between the first shield and the second shield, the read sensor including a pinned layer, a nonmagnetic spacer layer and a free layer, the nonmagnetic spacer layer being between the pinned layer and the free layer, the free layer including a plurality of ferromagnetic layers interleaved with and sandwiching a single nonmagnetic layer, the plurality of ferromagnetic layers being ferromagnetically aligned and at least one of weakly ferromagnetically coupled, magnetically coupled and antiferromagnetically coupled, the plurality of ferromagnetic layers consisting of a single material, the plurality of ferromagnetic layers being a plurality of CoB layers.

14. A magnetic transducer having an air-bearing surface (ABS) and comprising:
a first shield;
a second shield; and
a read sensor between the first shield and the second shield, the read sensor including a pinned layer, a nonmagnetic spacer layer and a free layer, the nonmagnetic spacer layer being between the pinned layer and the free layer, the free layer including a CoFe layer, a plurality of CoB layers interleaved with and sandwiching a plurality of Ru layers, the plurality of CoB layers being ferromagnetically coupled through the plurality of Ru layers via a Ruderman-Kittel-Kasuya-Yosida (RKKY) interaction, the CoFe layer adjoining the nonmagnetic spacer layer and being between the plurality of CoB layers and the nonmagnetic spacer layer, each of the plurality of Ru layers having a thickness of at least three and not more than seven Angstroms, the plurality of CoB layers having a total thickness of at least fifty Angstroms and not more than eighty Angstroms, the plurality of CoB layers includes at least three and not more than seven CoB layers.

15. A disk drive comprising:
a media;
a slider including a magnetic read transducer having an air-bearing surface (ABS), the slider including magnetic transducer having a first shield, a second shield, and a read sensor between the first shield and the second shield, the read sensor including a pinned layer, a nonmagnetic spacer layer and a free layer, the nonmagnetic spacer layer being between the pinned layer and the free layer, the free layer including a plurality of ferromagnetic layers interleaved with and sandwiching a plurality of nonmagnetic layers, the plurality of ferromagnetic layers being ferromagnetically coupled through the plurality of nonmagnetic layers, the plurality of ferromagnetic layers consisting of a single material, the plurality of ferromagnetic layers being a plurality of CoB layers.

* * * * *